United States Patent
Song et al.

(10) Patent No.: US 10,163,845 B2
(45) Date of Patent: Dec. 25, 2018

(54) METHOD AND APPARATUS FOR MEASURING A FREE AIR BALL SIZE DURING WIRE BONDING

(71) Applicants: Keng Yew Song, Singapore (SG); Yi Bin Wang, Singapore (SG); Zuo Cheng Shen, Singapore (SG); Jia Le Luo, Singapore (SG); Qing Le Tan, Singapore (SG)

(72) Inventors: Keng Yew Song, Singapore (SG); Yi Bin Wang, Singapore (SG); Zuo Cheng Shen, Singapore (SG); Jia Le Luo, Singapore (SG); Qing Le Tan, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 104 days.

(21) Appl. No.: 14/320,851

(22) Filed: Jul. 1, 2014

(65) Prior Publication Data

US 2015/0008251 A1 Jan. 8, 2015

(30) Foreign Application Priority Data

Jul. 4, 2013 (SG) ................................ 201305207-1

(51) Int. Cl.
 *B23K 20/00* (2006.01)
 *H01L 23/00* (2006.01)
(52) U.S. Cl.
 CPC .............. *H01L 24/78* (2013.01); *H01L 24/85* (2013.01); *B23K 20/007* (2013.01); *H01L 24/48* (2013.01);
(Continued)
(58) Field of Classification Search
 CPC ...................................... B23K 20/004–20/007
 See application file for complete search history.

(56) References Cited

U.S. PATENT DOCUMENTS

| 4,925,083 A | * | 5/1990 | Farassat | B23K 20/007 228/102 |
| 5,326,015 A | * | 7/1994 | Weaver | B23K 20/007 228/102 |

(Continued)

FOREIGN PATENT DOCUMENTS

TW 201308454 A 2/2013

OTHER PUBLICATIONS

Hang et al.,"Bonding wire characterization using automatic deformability measurement", Microelectronic Engineering, 2008, p. 1795-1803.*

(Continued)

*Primary Examiner* — Devang R Patel
(74) *Attorney, Agent, or Firm* — Ostrolenk Faber LLP

(57) ABSTRACT

Disclosed is a method of measuring a free air ball size during a wire bonding process of a wire bonder, which comprises a position sensor and a bonding tool for forming an electrical connection between a semiconductor device and a substrate using a bonding wire. Specifically, the method comprises the steps of: forming a free air ball from a wire tail of the bonding wire; using the position sensor to determine a positional difference between a first and a second position of the bonding tool with respect to a reference position, wherein the first position of the bonding tool is a position of the bonding tool with respect to the reference position when the free air ball contacts a conductive surface; and measuring the free air ball size based on the positional difference of the bonding tool as determined by the position sensor. A wire bonder configured to perform such a method is also disclosed.

8 Claims, 3 Drawing Sheets

(52) U.S. Cl.
CPC .............. *H01L 2224/48091* (2013.01); *H01L 2224/48247* (2013.01); *H01L 2224/48465* (2013.01); *H01L 2224/789* (2013.01); *H01L 2224/78268* (2013.01); *H01L 2224/78301* (2013.01); *H01L 2224/859* (2013.01); *H01L 2224/85045* (2013.01); *H01L 2224/85181* (2013.01); *H01L 2224/85205* (2013.01); *H01L 2924/00014* (2013.01)

(56) References Cited

U.S. PATENT DOCUMENTS

| | | | | |
|---|---|---|---|---|
| 6,062,462 | A * | 5/2000 | Gillotti | B23K 20/007 219/56.21 |
| 7,857,190 | B2 * | 12/2010 | Takahashi | H01L 24/78 228/102 |
| 2003/0098426 | A1 * | 5/2003 | Hayata | B23K 20/004 250/559.34 |
| 2005/0061849 | A1 * | 3/2005 | Takahashi | B23K 20/004 228/4.5 |
| 2005/0284914 | A1 * | 12/2005 | Beatson | B23K 20/007 228/4.5 |
| 2014/0034712 | A1 | 2/2014 | Maeda et al. | |
| 2014/0131425 | A1 * | 5/2014 | Liu | B23K 3/08 228/104 |
| 2014/0246480 | A1 * | 9/2014 | Gillotti | H01L 22/14 228/102 |
| 2015/0008251 | A1 * | 1/2015 | Song | H01L 24/78 228/41 |
| 2016/0351536 | A1 | 12/2016 | Maeda et al. | |

OTHER PUBLICATIONS

Notice of Preliminary Rejection with Search Report dated Dec. 21, 2015 in corresponding Taiwanese Patent Application No. 10-2014-0082352 (with English language translation)(total 8 pages).

* cited by examiner

METHOD AND APPARATUS FOR MEASURING A FREE AIR BALL SIZE DURING WIRE BONDING

FIELD OF THE PRESENT INVENTION

This invention relates to a method of measuring a free air ball size during a wire bonding process of a wire bonder, as well as a wire bonder configured to perform such a method.

BACKGROUND OF THE INVENTION

Bonding apparatus are used in semiconductor assembly and packaging. An example of a bonding apparatus is a wire bonder, which makes electrical wire connections between electrical contact pads of semiconductor dice and a substrate—a process which is known as wire bonding. Specifically, a bonding wire is fed from a wire spool to a bonding tool (e.g. a capillary) to make the electrical wire connections between the semiconductor dice and the substrate during wire bonding.

One method of wire bonding uses a ball bond and involves a series of steps, as follows: i) melting a bonding wire tail that protrudes from a base of the capillary to produce a free air ball; ii) lowering the free air ball to an electrical contact pad of a semiconductor die; and iii) welding the free air ball to the substrate via ball bonding. The capillary then draws out a loop of the bonding wire starting from the ball bond and ending with a wedge bond to electrically connect the semiconductor die with the substrate. Thereafter, the capillary is raised to expose a length of bonding wire from the capillary base, before the bonding wire is clamped and pulled in a direction away from the substrate to detach from the wedge bond. This thereby forms another wire tail. The tip of the wire tail is then positioned at a fire level, where an Electrical Flame-Off ("EFO") system applies a high voltage from an electrical torch to the wire tail to thereby melt the wire tail and produce a new free air ball that is used for a next ball bonding process with the semiconductor die.

The free air ball size is controlled by the EFO system current and exposure time, and is conventionally checked by a user who measures the size of the free air ball under a scanning electron microscope ("SEM"). If the FAB size does not meet the desired specification(s), the user would then need to adjust the EFO system current and/or exposure time manually. Thus, the productivity of the wire bonder is affected by such manual intervention to measure the free air ball size.

Accordingly, it is an object of this invention to ameliorate the above limitation of conventional wire bonder and to provide the general public with one or more useful methods to increase the productivity of wire bonders.

SUMMARY OF THE INVENTION

A first aspect of the invention is a method of measuring a free air ball size during a wire bonding process of a wire bonder, which has a position sensor and a bonding tool for forming an electrical connection between a semiconductor device and a substrate using a bonding wire. Specifically, the method comprises the steps of: forming a free air ball from a wire tail of the bonding wire; using the position sensor to determine a positional difference between a first and a second position of the bonding tool with respect to a reference position, wherein the first position of the bonding tool is a position of the bonding tool with respect to the reference position when the free air ball contacts a conductive surface; and measuring the free air ball size based on the positional difference of the bonding tool as determined by the position sensor.

A second aspect of the invention is a wire bonder, comprising: a bonding tool operative to form an electrical connection between a semiconductor device and a substrate using a bonding wire; a position sensor operative to determine a positional difference between a first and a second position of the bonding tool with respect to a reference position, wherein the first position of the bonding tool is a position of the bonding tool with respect to the reference position when a free air ball contacts a conductive surface, the free air ball being formed from a wire tail of the bonding wire; and a processor configured to measure a size of the free air ball based on the positional difference of the bonding tool as determined by the position sensor.

Some optional steps/features of the invention have been defined in the dependent claims. For example, the second position of the bonding tool may either be a position of the bonding tool with respect to the reference position when the wire tail contacts the conductive surface, or a position of the bonding tool with respect to the reference position when a base of the bonding tool contacts the conductive surface.

BRIEF DESCRIPTION OF THE DRAWINGS

Preferred embodiments of the invention will now be described with reference to the accompanying drawings, of which.

DETAILED DESCRIPTION OF THE PREFERRED EMBODIMENTS

Figure 1:
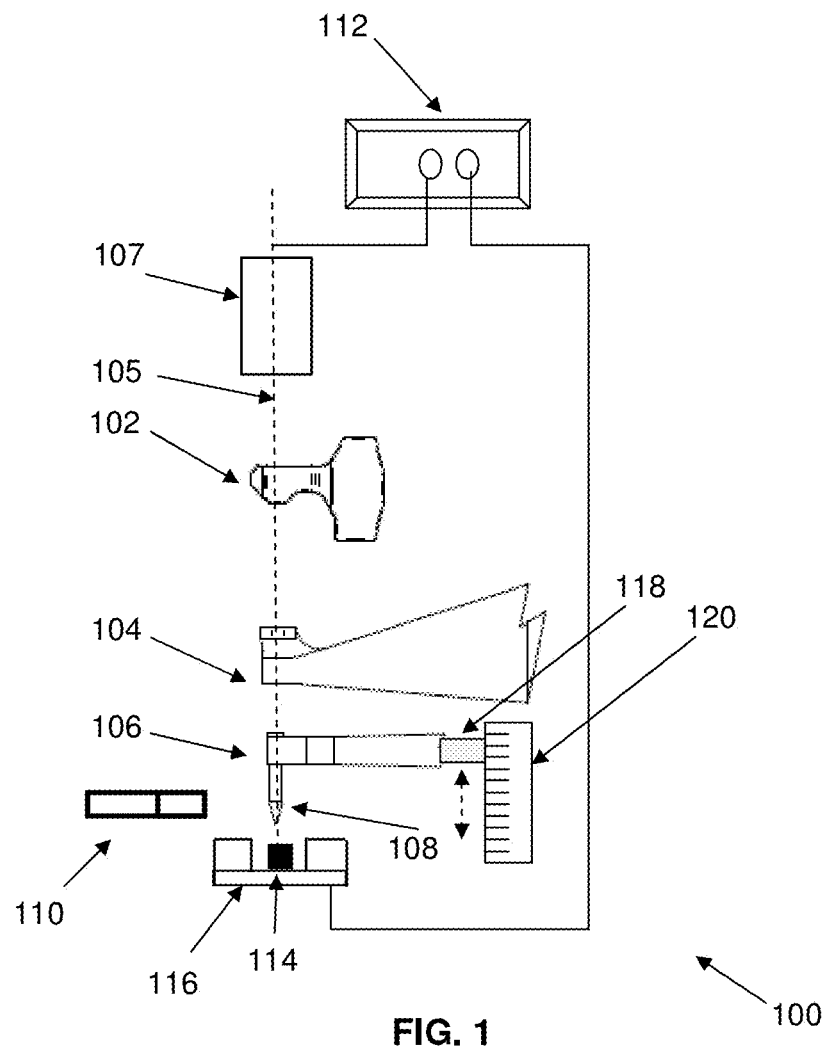
FIG. 1 shows a wire bonder having a bonding tool for wire bonding.

FIG. 1 shows a bonding apparatus (shown as a wire bonder 100) for wire bonding. The wire bonder 100 comprises: i) an upper clamp 102 and a lower clamp 104 for controlling the movement of a bonding wire 105 that is fed from a wire spool (not shown) along a wire-feeding path using a pneumatic device (shown as an air tensioner 107); ii) a transducer horn 106 for producing ultrasonic vibrations during wire bonding; iii) a bonding tool (shown as a capillary 108) through which the bonding wire 105 is fed during wire bonding; iv) an EFO torch 110 for generating an electrical discharge to create a free air ball at a tail end of the bonding wire 105; v) a contact sensor 112 responsive to contact between objects; and vi) a position sensor (shown in FIG. 1 as an encoder 118) movable relative to a linear scale 120 to determine and measure a position of the capillary 108 with respect to a reference position.

A wire bonding process of the wire bonder 100 will now be described with reference to FIG. 1. First, the wire bonder 100 forms a first wire bond—in particular, a ball bond—on a top surface of a semiconductor die 114 (which is arranged on a substrate; shown as a lead frame 116) using the bonding wire 105. Thereafter, the wire bonder 100 forms a second wire bond—in particular, a wedge bond—on a top surface of the lead frame 116 using the bonding wire 105 such that a wire loop connects between the ball bond and the wedge bond. After the wire bonder 100 has performed wedge bonding on the lead frame 116, the capillary 108 is moved in a direction away from the wedge bond such that the base of the capillary 108 is positioned at a predetermined position. It should be noted that before the capillary 108 moves away from the wedge bond, the upper and lower clamps 102, 104 are opened to prevent any tension that might prematurely break the bonding wire 105 from the wedge bond. Once the base of the capillary 108 is positioned at its predetermined position, the lower wire clamp 104 is then closed to exert a gripping force on the bonding wire 105. Thereafter, the capillary 108 is moved further away from the wedge bond upwards along a Z-axis by a tail break height in order to pull the bonding wire 105 away from the wedge bond. This creates a tension that breaks and separates the bonding wire 105 from the wedge bond to form a wire tail of a length substantially similar to a predetermined wire tail length. The wedge bond, however, should remain bonded to the lead frame 116. The wire tail that is formed corresponds to the portion of the bonding wire 105 that protrudes from the base of the capillary 108.

FIGS. 2a to 2d show a method of measuring the size of a free air ball during the wire bonding according to a first embodiment of the invention.

Figures 2A, 2B, 2C, 2D:
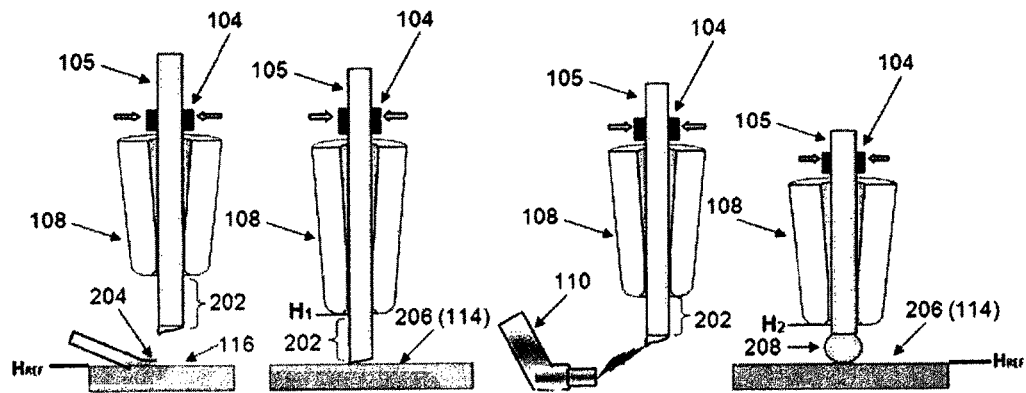
FIGS. 2a to 2d show the steps of measuring the size of a free air ball during wire bonding in accordance with a first embodiment of the invention.

FIG. 2a shows a wire tail 202 formed after the bonding wire 105 is separated from a wedge bond 204 on the lead frame 116. The wire bonder 100 then moves the capillary 108 towards a conductive surface 206, until the bottom tip of the bonding wire 105 contacts the conductive surface 206 as shown in FIG. 2b. Since the contact sensor 112 is electrically connected between the bonding wire 105 and the conductive surface 206, an electrical circuit is accordingly formed by such an arrangement—that is, a closed electrical circuit is formed when the bottom tip of the bonding wire 105 contacts the conductive surface 206, and an open electrical circuit is formed when such a contact is absent. Thus, the contact sensor 112 is responsive to contact between the bottom tip of the bonding wire 105 and the conductive surface 206. It should be noted that the conductive surface 206 may either be an electrically-conductive top surface of the semiconductor die 114, or an electrically-conductive top surface of the lead frame 116. Also, it should be noted that the lower clamp 104 should be closed, and the upper clamp 102 opened, as the capillary 108 is moved towards the conductive surface 206 together with the lower clamp 104.

As the capillary 108 is successively lowered towards the conductive surface 206, a processor of the wire bonder 100 measures the distance as moved by the capillary 108 until the bottom tip of the wire tail 202 contacts the conductive surface 206, whereupon the contact sensor 112 detects a closed electrical circuit between the bonding wire 105 and the conductive surface 206. It should be noted that as the capillary 108 is being successively lowered towards the conductive surface 206, the encoder 118 also moves together with the capillary 108 relative to the linear scale 120. Thus, the encoder 118 is capable of measuring a Z-level (or height) of the capillary 108 as it moves upward and downward relative to the linear scale 120 during the bonding process. This allows a position of the capillary 108 with respect to a reference position to be measured using the encoder 118 when the wire tail 202 contacts the conductive surface 206. More specifically, the height ($H_1$) of the base of the capillary 108 with respect to a reference height ($H_{REF}$) along the Z-axis can be measured using the encoder 118 when the wire tail 202 contacts the conductive surface 206.

Subsequently, the EFO torch 110 directs an electrical discharge at the wire tail 202 of the bonding wire 105—as shown in FIG. 2c—to form a free air ball 208 as shown in FIG. 2d. FIG. 2d also shows the capillary 108 being successively lowered towards the conductive surface 206 until the free air ball 208 contacts the conductive surface 206, whereupon the contact sensor 112 detects a closed electrical circuit between the free air ball 208 and the conductive surface 206. Likewise, this allows a position of the capillary 108 with respect to the reference position to be measured using the encoder 118 when the free air ball 208 contacts the conductive surface 206. More specifically, the height ($H_2$) of the base of the capillary 108 with respect to $H_{REF}$ along the Z-axis can be measured using the encoder 118 when the free air ball 208 contacts the conductive surface 206.

Figure 3:
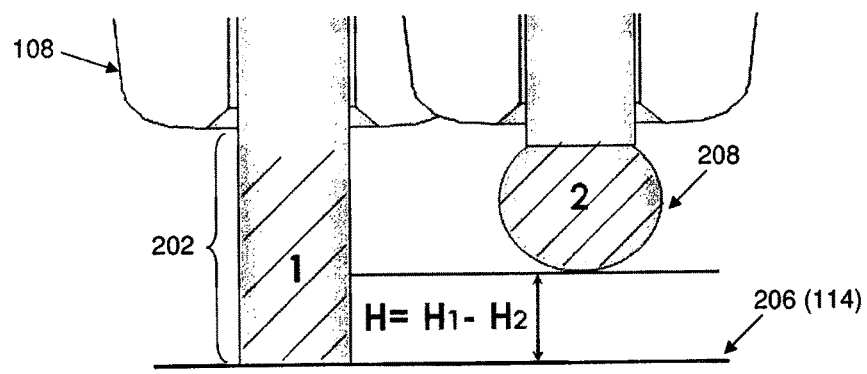
FIG. 3 shows a positional difference of the bonding tool when the wire tail contacts a conductive surface and when the free air ball contacts the conductive surface, according to the first embodiment of the invention.

Referring to FIG. 3, and based on the law of conservation of mass, the inventors have discovered that the volume ($V_1$) of the wire tail 202 is consistent with the volume ($V_2$) of the free air ball 208 that is subsequently formed. Since the radius (r) of the bonding wire 105 is known, and the difference (H) between the measured heights of $H_1$ and $H_2$ can be derived by the processor of the wire bonder 100, the unknown radius (R) of the free air ball 208 can accordingly be derived from the following equations:

$$V_1 = V_2$$
$$[2R - (R - \sqrt{R^2 - r^2}) + H] \times \pi r^2 = \frac{4}{3}\pi R^3 - \frac{\pi}{3}(R - \sqrt{R^2 - r^2})^2 \times [3R - (R - \sqrt{R^2 - r^2})]$$

Preferably, the conductive surface 206 corresponds to a top surface of the semiconductor die 114, as the free air ball 208 will eventually be bonded thereto.

Figures 4A, 4B:
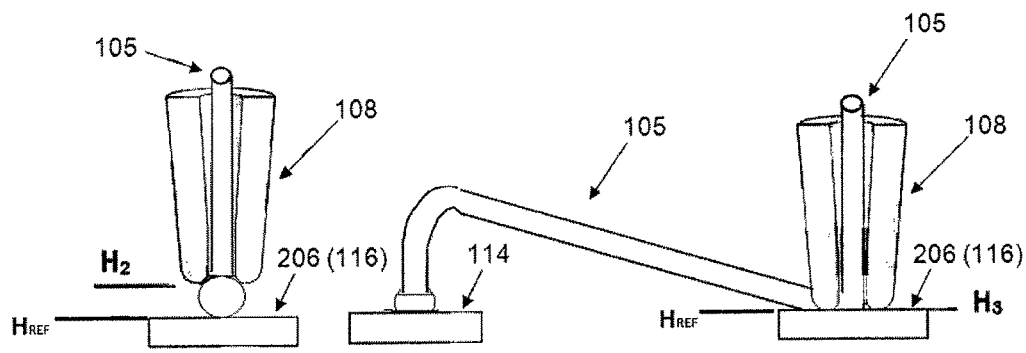
FIGS. 4a and 4b show the steps of measuring the size of a free air ball during wire bonding in accordance with a second embodiment of the invention.

FIGS. 4a and 4b show another method of measuring the size of a free air ball during wire bonding according to a second embodiment of the invention.

In this embodiment, after the free air ball 208 is formed, the height ($H_2$) of the base of the capillary 108 with respect to $H_{REF}$ along the Z-axis when the free air ball 208 contacts the conductive surface 206 is first measured using the encoder 118, as shown in FIG. 4a. Subsequently, the wire bonder 100 performs ball bonding on the semiconductor die 114 followed by wedge bonding on the lead frame 116. Next, the height ($H_3$) of the base of the capillary 108 with respect to $H_{REF}$ when the base of the capillary 108 contacts the conductive surface 206 is determined, as shown in FIG. 4b. This allows the separation between the base of the capillary 108 and the conductive surface 206, in the presence of the free air ball 208, to be determined.

Figure 5:
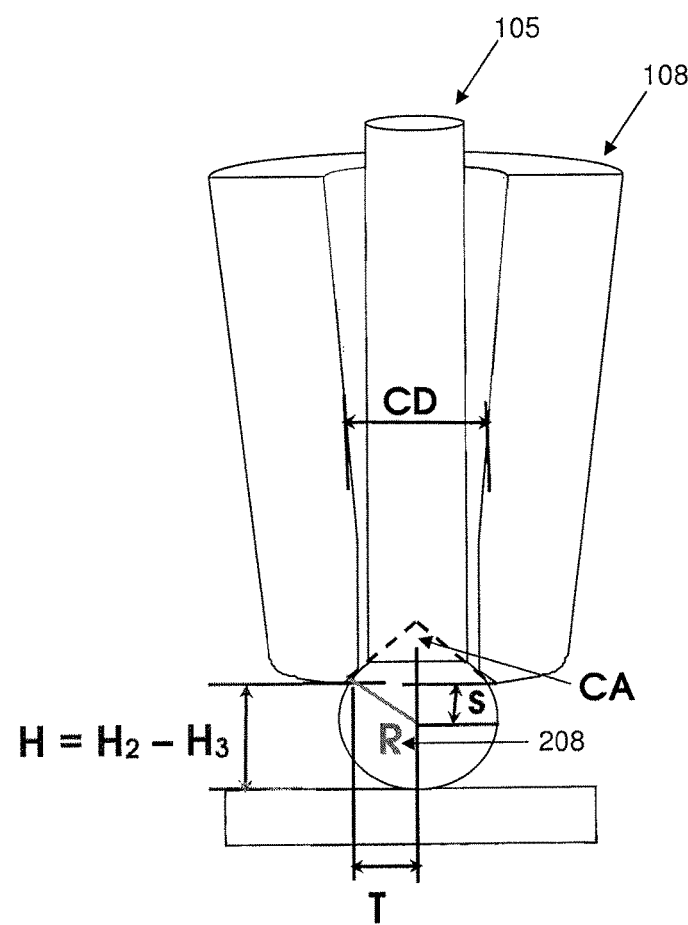
FIG. 5 shows the position of the bonding tool when the free air ball contacts a conductive surface according to the second embodiment of the invention.

With reference to FIG. 5, the inventors have further discovered that since the capillary chamfer diameter (CD) and the capillary chamfer angle (CA) between the free air ball 208 and the capillary 108 are known, the unknown radius (R) of the free air ball 208 can accordingly be derived from the following equations:

$$R = \sqrt{S^2 + T^2}, \text{ whereby}$$

-continued $$T = R \times \cos\left(\frac{CA}{2}\right);$$

and $$S = R \times \sin\left(\frac{CA}{2}\right)$$

Preferably, the conductive surface 206 corresponds to a top surface of the lead frame 116, so that the position of the base of the capillary 108 can be determined immediately after the wedge bond on the lead frame 116 has been formed.

It should be appreciated that the above methods of measuring the free air ball size take into account the fact that a (small) portion of the free air ball 208 is pushed into the capillary 108 due to contact with the conductive surface 206, as can be seen in FIG. 5.

Advantageously, these methods of measuring the size of the free air ball 208 allow the wire bonder 100 to perform these methods automatically and, accordingly, fine-tuning of the operating specifications can also be automatically performed to provide a free air ball of the desired size. Moreover, these methods also mean that any size difference of the free air ball 208 produced by different wire bonders can be reduced through real-time monitoring during wire bonding. Feasibility studies done by the inventors have also shown that these methods of measuring the size of the free air ball 208 produce results that are closer to corresponding results derived using an SEM, as opposed to results derived using a standard microscope. It is typically known that the SEM is much more accurate than the standard microscope.

It should be appreciated that other embodiments of the invention may also fall within the scope of the invention as claimed. For example, the $H_{REF}$ may correspond to the conductive surface 206 and, indeed, any level along the Z-axis so long as the chosen level remains constant during measurement.

The invention claimed is:

1. A method of measuring a free air ball size during a wire bonding process of a wire bonder, the wire bonder having a position sensor and a bonding tool for forming an electrical connection between a semiconductor device and a substrate using a bonding wire, the method comprising the steps of:
    forming a free air ball from a wire tail of the bonding wire;
    using the position sensor to determine a positional difference between a free air ball contact position and a corresponding non-free air ball contact position of the bonding tool;
    wherein the free air ball contact position of the bonding tool is a position of the bonding tool when the free air ball contacts a conductive surface and the non-free air ball contact position is a position of the bonding tool when the wire tail contacts the conductive surface before the formation of the free air ball;
    measuring a volume of the wire tail that has been formed into the free air ball based on the positional difference; and
    calculating a volume of the free air ball based on the volume of the wire tail that has been determined from measuring the positional difference.

2. The method of claim 1, wherein the non-free air ball contact position of the bonding tool is a position of the bonding tool when the wire tail contacts a bonding surface of the semiconductor device.

3. The method of claim 1, wherein the step of measuring the free air ball volume is based on the conservation of mass between the wire tail and the free air ball.

4. The method of claim 1, wherein the non-free air ball contact position of the bonding tool is a position of the bonding tool when a base of the bonding tool contacts a bonding surface of the substrate.

5. A method of measuring a free air ball size during a wire bonding process of a wire bonder, the wire bonder having a position sensor and a bonding tool for forming an electrical connection between a semiconductor device and a substrate using a bonding wire, the method comprising the steps of:
    forming a free air ball from a wire tail of the bonding wire;
    using the position sensor to determine a positional difference between a free air ball contact position and a non-free air ball contact position of the bonding tool, wherein the free air ball contact position of the bonding tool is a position of the bonding tool when the free air ball contacts a conductive surface; and
    measuring the free air ball size based on the positional difference of the bonding tool as determined by the position sensor;
    wherein the non-free air ball contact position of the bonding tool is a position of the bonding tool when a base of the bonding tool contacts the conductive surface; and
    the step of measuring the free air ball size further comprises the step of deriving a radius of the free air ball based on a chamfered diameter of the bonding tool and a chamfered angle between the free air ball and the bonding tool.

6. The method of claim 1, wherein the step of using the position sensor to determine the positional difference of the bonding tool comprises using an encoder to measure respective heights of the bonding tool.

7. The method of claim 1, wherein the free air ball volume is measured in relation to a radius of the free air ball.

8. The method of claim 1, wherein the free air ball contact and non-free air ball contact positions of the bonding tool are the respective positions of a base of the bonding tool.

* * * * *